(12) United States Patent
Chow et al.

(10) Patent No.: US 8,102,040 B2
(45) Date of Patent: *Jan. 24, 2012

(54) INTEGRATED CIRCUIT PACKAGE SYSTEM WITH DIE AND PACKAGE COMBINATION

(75) Inventors: Seng Guan Chow, Singapore (SG); Ming Ying, Singapore (SG); Il Kwon Shim, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/544,555

(22) Filed: Aug. 20, 2009

(65) Prior Publication Data

US 2009/0309207 A1    Dec. 17, 2009

Related U.S. Application Data

(63) Continuation of application No. 11/164,453, filed on Nov. 22, 2005, now Pat. No. 7,598,606.

(60) Provisional application No. 60/593,897, filed on Feb. 22, 2005.

(51) Int. Cl.
*H01L 23/02* (2006.01)
*H01L 21/50* (2006.01)

(52) U.S. Cl. ......... 257/686; 257/E23.046; 257/E23.052; 257/E23.18; 257/E23.116; 257/E21.499; 257/E23.085; 257/E23.126; 257/E23.114; 257/690; 257/787; 257/723; 257/685; 257/777; 257/666; 438/109; 438/123; 438/124

(58) Field of Classification Search .............. 257/686, 257/E23.085, E23.052, E23.046, E23.126, 257/E23.114, 787, 723, 685, 777, 666, 690, 257/E23, 18, E23.116, E21.499; 438/109, 438/124, 123

See application file for complete search history.

(56) References Cited

U.S. PATENT DOCUMENTS

| | | | |
|---|---|---|---|
| 4,363,076 A | 12/1982 | McIver | |
| 5,291,061 A | 3/1994 | Ball | |
| 5,323,060 A | 6/1994 | Fogal et al. | |
| 6,005,778 A | 12/1999 | Spielberger et al. | |
| 6,445,064 B1 | 9/2002 | Ishii et al. | |
| 6,500,698 B2 | 12/2002 | Shin | |
| 6,677,665 B2 | 1/2004 | Huang | |
| 6,781,243 B1 | 8/2004 | Li et al. | |
| 6,815,255 B2 * | 11/2004 | Nakaoka et al. | 438/108 |
| 6,838,754 B2 | 1/2005 | Kim | |
| 6,949,838 B2 | 9/2005 | Brand | |
| 7,008,822 B2 | 3/2006 | Bolken et al. | |
| 7,057,281 B2 | 6/2006 | Peng et al. | |
| 7,071,545 B1 | 7/2006 | Patel et al. | |
| 7,190,062 B1 * | 3/2007 | Sheridan et al. | 257/686 |
| 7,193,309 B2 | 3/2007 | Huang et al. | |
| 7,227,249 B1 | 6/2007 | Chiang | |

(Continued)

*Primary Examiner* — A O Williams
(74) *Attorney, Agent, or Firm* — Mikio Ishimaru

(57) ABSTRACT

An integrated package system with die and package combination includes forming a leadframe having internal leads and external leads, encapsulating a first integrated circuit on the leadframe, and encapsulating a second integrated circuit over the first integrated circuit.

17 Claims, 9 Drawing Sheets

U.S. PATENT DOCUMENTS

| | | |
|---|---|---|
| 7,298,038 B2 | 11/2007 | Filoteo, Jr. et al. |
| 7,309,913 B2 * | 12/2007 | Shim et al. ............... 257/686 |
| 7,381,593 B2 * | 6/2008 | Ararao et al. ............. 438/123 |
| 7,388,280 B2 * | 6/2008 | Shim et al. ............... 257/666 |
| 7,595,551 B2 * | 9/2009 | Ramakrishna ........... 257/666 |
| 7,598,606 B2 * | 10/2009 | Chow et al. ............. 257/686 |
| 7,629,677 B2 * | 12/2009 | Youn et al. .............. 257/676 |
| 2002/0022300 A1 * | 2/2002 | Shin ......................... 438/109 |
| 2002/0079590 A1 * | 6/2002 | Nakaoka et al. .......... 257/777 |
| 2005/0090050 A1 | 4/2005 | Shim et al. |
| 2005/0275077 A1 | 12/2005 | Tan et al. |
| 2006/0001136 A1 | 1/2006 | Tao et al. |
| 2006/0022315 A1 | 2/2006 | Huang et al. |
| 2006/0091516 A1 | 5/2006 | Matsunami |
| 2006/0102989 A1 | 5/2006 | Lee et al. |
| 2006/0102994 A1 | 5/2006 | Pu |
| 2006/0192279 A1 | 8/2006 | Tsai et al. |
| 2006/0197207 A1 * | 9/2006 | Chow et al. ............. 257/686 |
| 2007/0170570 A1 | 7/2007 | Camacho et al. |
| 2007/0210424 A1 | 9/2007 | Ho et al. |
| 2008/0157321 A1 | 7/2008 | Camacho et al. |
| 2009/0127680 A1 * | 5/2009 | Do et al. .................. 257/675 |

* cited by examiner

INTEGRATED CIRCUIT PACKAGE SYSTEM WITH DIE AND PACKAGE COMBINATION

CROSS-REFERENCE TO RELATED APPLICATION(S)

This application is a continuation of U.S. patent application Ser. No. 11/164,453, filed Nov. 22, 2005, now U.S. Pat. No. 7,598,606, which claims the benefit of U.S. Provisional Patent Application Ser. No. 60/593,897 filed Feb. 22, 2005, and the subject matter thereof is hereby incorporated herein by reference thereto.

TECHNICAL FIELD

The present invention relates generally to integrated circuit package systems, and more particularly to a system for an integrated circuit package system with die and package combination.

BACKGROUND ART

Integrated circuits are used in many portable electronic products, such as cell phone, portable computers, voice recorders, etc. as well as in many larger electronic systems, such as cars, planes, industrial control systems, etc. Across virtually all applications, there continues to be demand for reducing the size and increasing performance of the devices. The intense demand is no more visible than in portable electronics that have become so ubiquitous.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Drawbacks of conventional designs include a relatively large footprint of the package on the mounting surface of motherboard. The footprint reflects what is typically the maximum dimension of the package, namely, the x-y dimension of the package. In applications where mounting space is at a premium, such as pagers, portable telephones, and personal computers, among others, a large footprint is undesirable. With the goal of increasing the amount of circuitry in a package, but without increasing the area of the package so that the package does not take up any more space on the circuit board, manufacturers have been stacking two or more die within a single package. Unfortunately, high wire inductance, wire shorting, insufficient terminal leads, die attach epoxy spreading, high cost film attach, costly spacer attach, die cracking, etc. have plagued many stacked die and stacked package designs.

Thus a need still remains for an integrated circuit package system to provide increasing density without sacrificing high volume manufacturing processes. In view of the increasing demand for density of integrated circuits and particularly portable electronic products, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated package system with die and package combination including forming a leadframe having internal leads and external leads, encapsulating a first integrated circuit on the leadframe, and encapsulating a second integrated circuit over the first integrated circuit.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
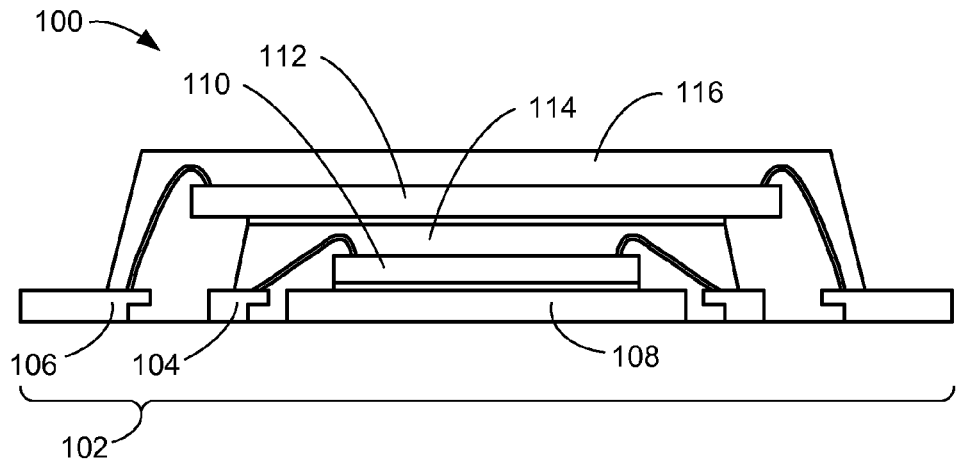
FIG. 1 is a cross-sectional view of an integrated circuit package system with die and package combination in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. The same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact between elements or components.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package system with die and package combination 100 in an embodiment of the present invention. The integrated circuit package system with die and package combination 100 includes a leadframe 102 having internal leads 104, external leads 106 and a die pad 108. A first integrated circuit 110, such as a bare die, a flip chip, or a passive component, and a second integrated circuit 112, such as a bare die, a pre-packaged system with an integrated circuit, or an interposer with active or passive components, are electrically connected to the leadframe 102.

A first encapsulant 114 is molded to cover one or more integrated circuits such as the first integrated circuit 110 mounted on the leadframe 102 and electrically connected to the internal leads 104. The first encapsulant 114 may form a mold cap to be used as a mounting surface, such as a die attach pad, for the second integrated circuit 112. A conductive layer (not shown), such as a plate or cap, may also be attached to the first encapsulant 114 prior to attaching the second integrated circuit 112. The conductive layer may provide thermal or electrical conduction, such as thermal dissipation or RF shielding.

A second encapsulant 116 is molded to cover one or more integrated circuits such as the second integrated circuit 112 mounted on the first encapsulant 114 and electrically connected to the external leads 106 of the leadframe 102. The second encapsulant 116 provides protection to the second integrated circuit 112, the external leads 106 and the leadframe 102. For illustrative purposes the second encapsulant 116 is shown as a different material than the first encapsulant 114, although it is understood that the second encapsulant 116 may be the same material, as well. Further for illustrative purposes, the integrated package system with die and package combination 100 is shown having two integrated circuits vertically stacked, although it is understood more than two integrated circuits or integrated circuit systems may be vertically stacked, as well.

Figure 2:
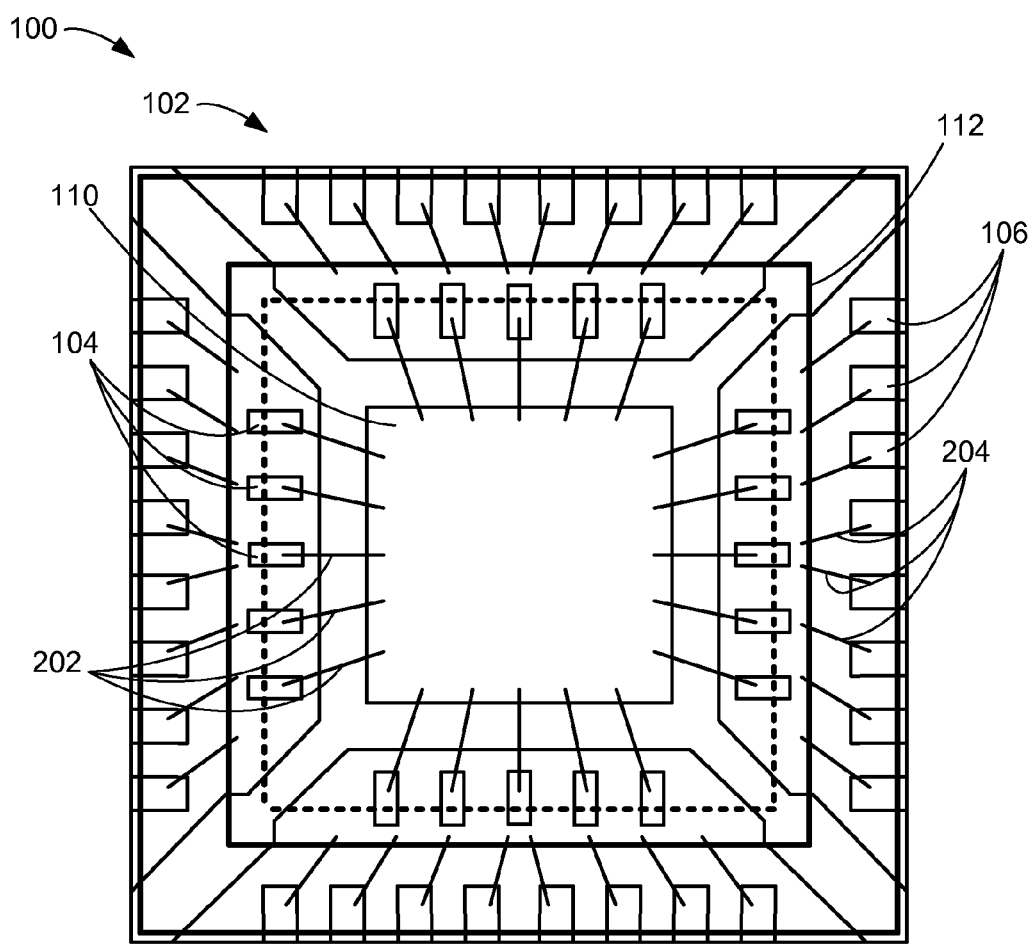
FIG. 2 is a top view of the integrated circuit package system with die and package combination in an embodiment of the present invention.

Referring now to FIG. 2, therein is shown a top view of the integrated circuit package system with die and package combination 100 in an embodiment of the present invention. The integrated circuit package system with die and package combination 100 includes the leadframe 102, the first integrated circuit 110 and the second integrated circuit 112. The leadframe 102 may include a pre-plated finish, such as NiPdAu, to provide a wire-bondable surface on the internal leads 104 and the external leads 106. The first integrated circuit 110 is electrically connected to the internal leads 104 of the leadframe 102 by first electrical interconnects 202, such as bond wires. The second integrated circuit 112 is mounted over the first integrated circuit 110 mounted to the leadframe 102. The second integrated circuit 112 is electrically connected to the external leads 106 of the leadframe 102 by second electrical interconnects 204.

For illustrative purposes the first integrated circuit 110, the internal leads 104 and the first electrical interconnects 202 are shown, although it is understood that the first integrated circuit 110, the internal leads 104 and the first electrical interconnects 202 are in separate plane below the second integrated circuit 112.

Figure 3:
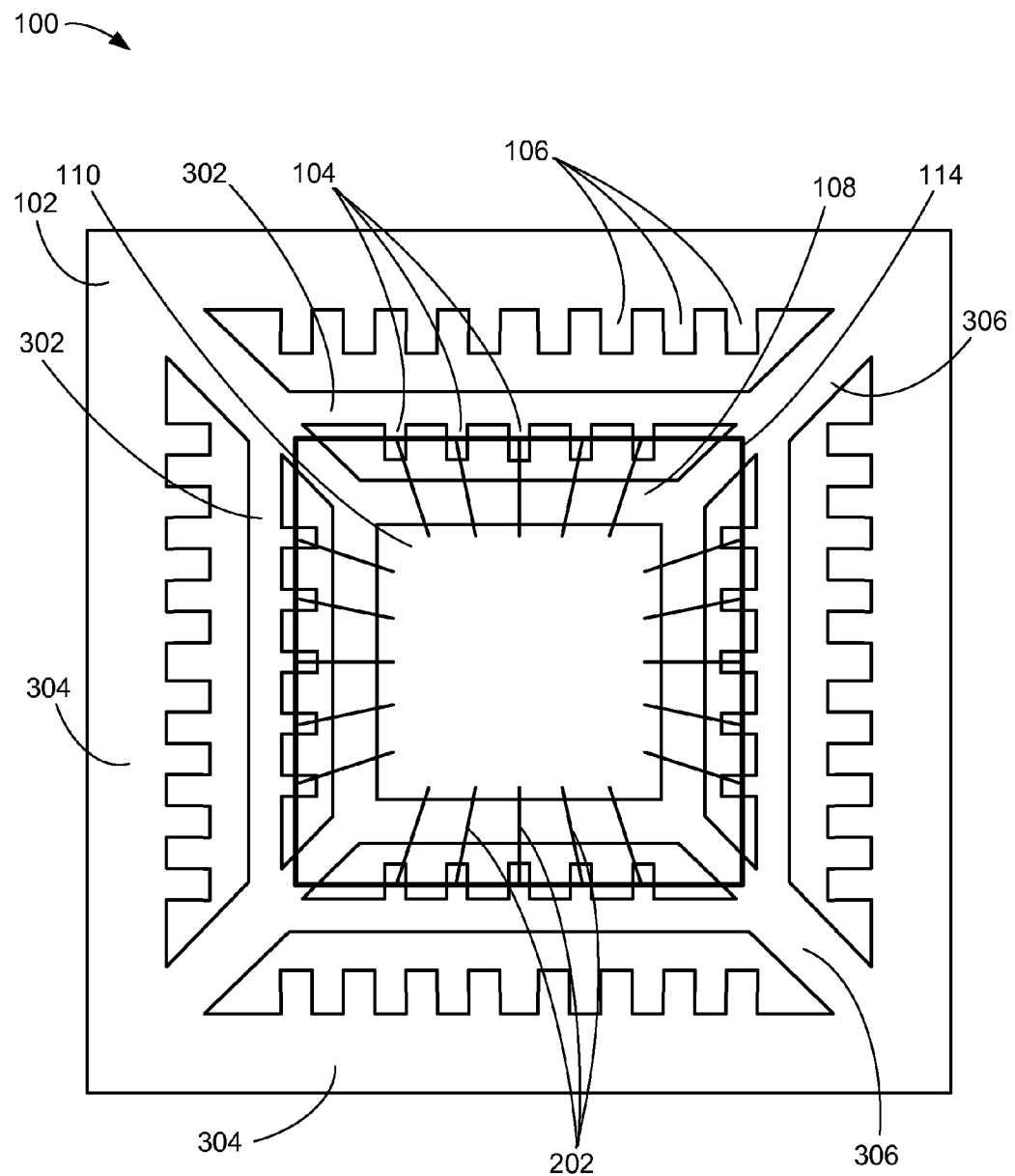
FIG. 3 is a top view of the integrated circuit package system with die and package combination in a first encapsulation phase.

Referring now to FIG. 3, therein is shown a top view of the integrated circuit package system with die and package combination 100 in a first encapsulation phase. The leadframe 102 includes internal dam bars 302, external dam bars 304 and tie bars 306. The internal dam bars 302 provide structural rigidity and substantially fixed positions to the internal leads 104 during processing. The substantially fixed positions of the internal leads 104 may be disposed at a different pitch than the external leads 106. The tie bars 306 may be bottom half-etched to provide a recessed region for a mold locking feature.

The first integrated circuit 110 is mounted to the die pad 108 and electrically connected to the internal leads 104 by the first electrical interconnects 202. The first encapsulant 114 is formed using a molding process, such as the pocket mold method. The pocket mold method may use either a lateral gate molding system or a direct top gate molding system. For illustrative purposes the first integrated circuit 110, the internal leads 104 and the first electrical interconnects 202 are shown, although it is understood that the first integrated circuit 110 and the first electrical interconnects 202 are covered by the first encapsulant 114, and the internal leads 104 may be partially covered by the first encapsulant 114.

Figure 4:
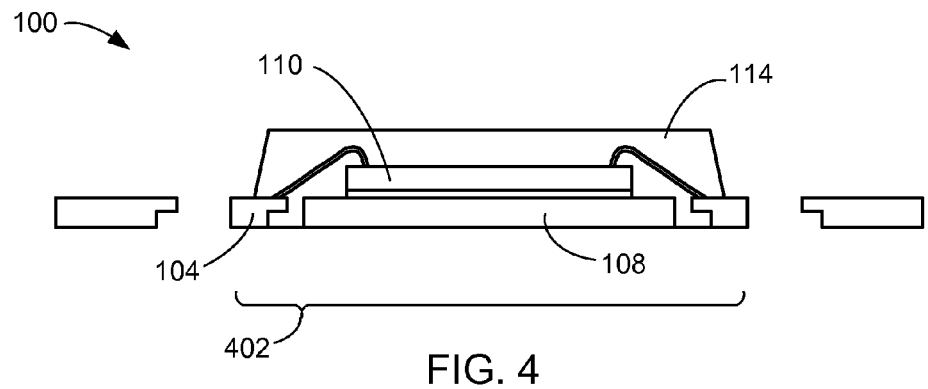
FIG. 4 is a cross-sectional view of the integrated circuit package system with die and package combination in an internal lead singulation phase.

Referring now to FIG. 4, therein is shown a cross-sectional view of the integrated circuit package system with die and package combination 100 in an internal lead singulation phase. An internal package 402 includes the first integrated circuit 110, the die pad 108 and the internal leads 104 encapsulated by the first encapsulant 114. The substantially fixed positions of each of the internal leads 104 are provided by the structural integrity of the first encapsulant 114. The internal dam bars 302 of FIG. 3 (not shown) have been removed from the internal leads 104. After removal of the internal dam bars 302 from the internal leads 104, each of the internal leads 104 is singulated and electrically isolated from one another. A removal process, such as cutting or punching, may be applied to the internal dam bars 302.

Figure 5:
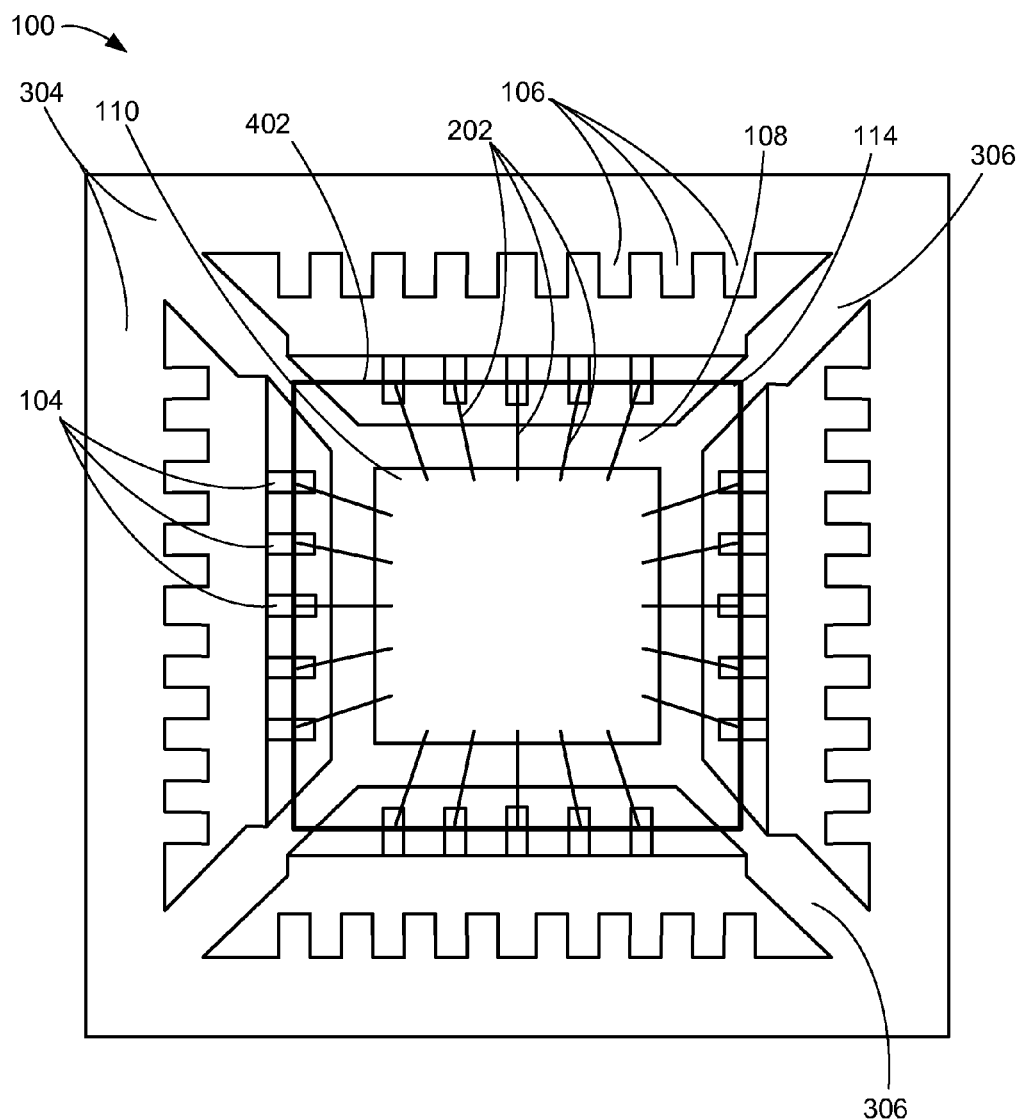
FIG. 5 is a top view of the integrated circuit package system with die and package combination in the internal lead singulation phase.

Referring now to FIG. 5, therein is shown a top view of the integrated circuit package system with die and package combination 100 in the internal lead singulation phase. The tie bars 306 connect the external dam bars 304 to the die pad 108 of the internal package 402 providing a substantially fixed position for the internal package 402 to the external leads 106. The first electrical interconnects 202 electrically connect the first integrated circuit 110 to each of the internal leads 104. The internal leads 104 may provide electrically discrete connection to a next level system, such as a printed circuit board (not shown).

For illustrative purposes the first integrated circuit 110, the internal leads 104 and the first electrical interconnects 202 are shown, although it is understood that the first integrated circuit 110 and the first electrical interconnects 202 are covered by the first encapsulant 114, and the internal leads 104 may be partially covered by the first encapsulant 114.

Figure 6:
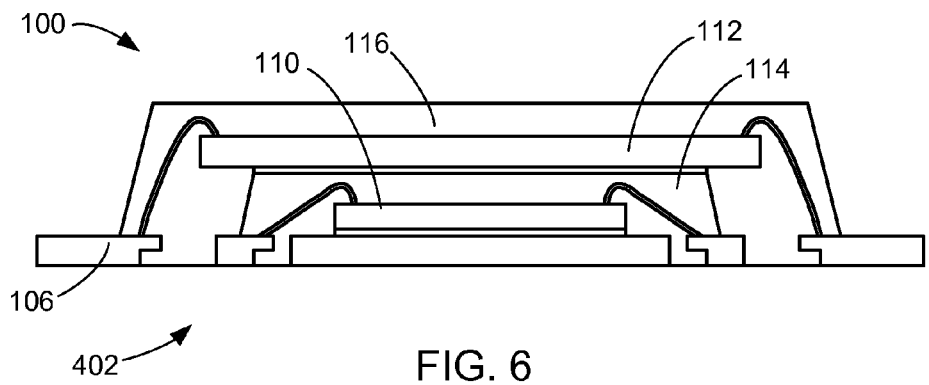
FIG. 6 is a cross-sectional view of the integrated circuit package system with die and package combination in a second encapsulation phase.

Referring now to FIG. 6, therein is shown a cross-sectional view of the integrated circuit package system with die and package combination 100 in a second encapsulation phase. The first encapsulant 114 may form a mold cap to be used as a mounting surface, such as a die attach pad, for the second integrated circuit 112. The second integrated circuit 112 is mounted over the internal package 402. The second integrated circuit 112 may be packaged, such as a quad flat no-lead (QFN) or a land grid array (LGA), prior to mounting over the first integrated circuit 110. Mounting a package including the second integrated circuit 112 provides a 3D packaging format, such as a package-in-package. The second encapsulant 116 is molded to cover the second integrated circuit 112 or the second integrated circuit 112 in a package (not shown), and may partially cover the external leads 106.

Figure 7:
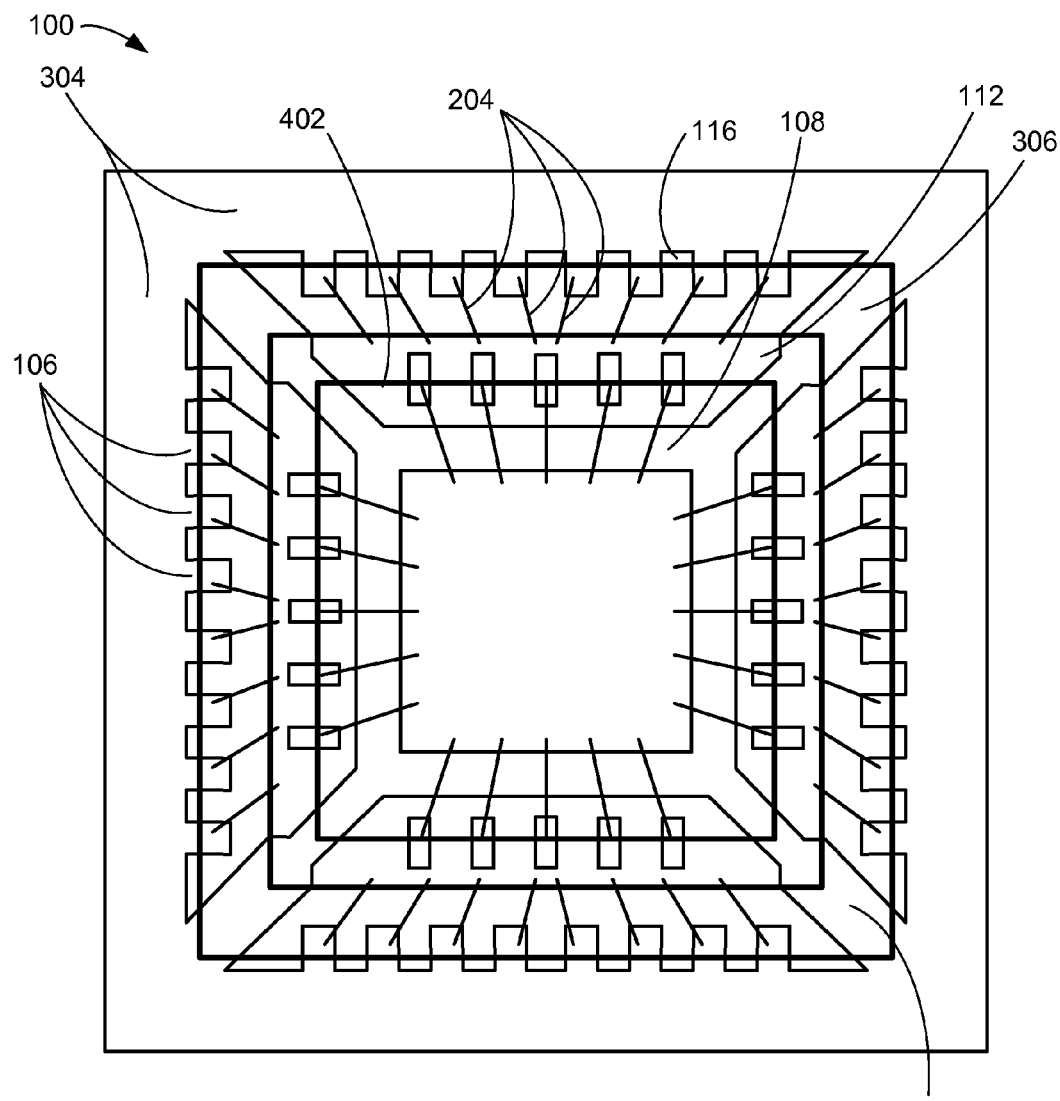
FIG. 7 is a top view of the integrated circuit package system with die and package combination in the second encapsulation phase.

Referring now to FIG. 7, therein is shown a top view of the integrated circuit package system with die and package combination 100 in the second encapsulation phase. The tie bars 306 connect the external dam bars 304 to the die pad 108 of the internal package 402 providing a substantially fixed position for the internal package 402 to the external leads 106. The second electrical interconnects 204 electrically connect the second integrated circuit 112 to each of the external leads 106. The external leads 106 may provide electrically discrete connection to a next level system, such as a printed circuit board (not shown), after removal of the external dam bars 304.

For illustrative purposes the internal package 402, the second integrated circuit 112, the external leads 106, and the second electrical interconnects 204 are shown, although it is understood that the internal package 402 and the second integrated circuit 112 are covered by the second encapsulant 116, and the external leads 106 may be partially covered by the second encapsulant 116.

Figure 8:
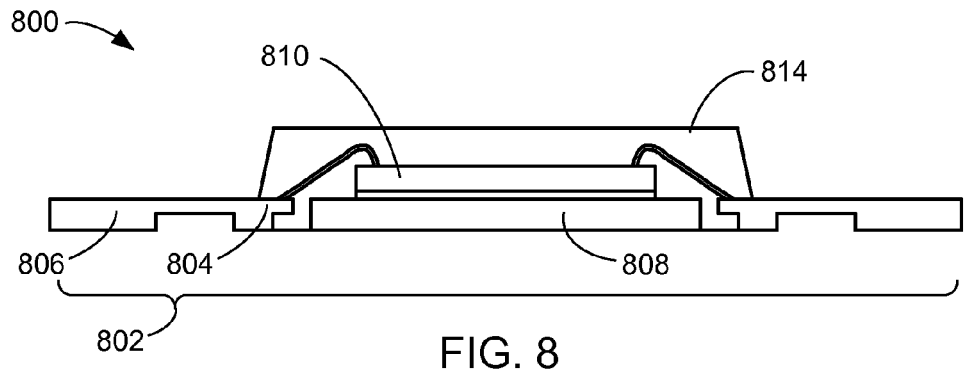
FIG. 8 is a cross-sectional view of an integrated circuit package system with die and package combination in an alternative embodiment of the present invention in a first encapsulation phase.

Referring now to FIG. 8, therein is shown a cross-sectional view of an integrated circuit package system with die and package combination 800 in an alternative embodiment of the present invention in a first encapsulation phase. The integrated circuit package system with die and package combination 800 includes a fused lead leadframe 802 having internal leads 804, external leads 806 and a die pad 808. A first integrated circuit 810, such as a bare die, a flip chip, or a passive component, and a second integrated circuit (not shown), such as a bare die, a pre-packaged system with an integrated circuit, or an interposer with active or passive components, are electrically connected to the fused lead leadframe 802.

A first encapsulant 814 is molded to cover one or more integrated circuits such as the first integrated circuit 810 mounted to the fused lead leadframe 802 and electrically connected to the internal leads 804. The first encapsulant 814 may form a mold cap to be used as a mounting surface, such as a die attach pad, for the second integrated circuit. A thermally or electrically conductive layer (not shown), such as a plate or cap, may also be attached to the first encapsulant 814 prior to attaching the second integrated circuit. The conductive layer may provide thermal or electrical conduction, such as thermal dissipation or RF shielding.

The fused lead leadframe 802 may provide interconnection between the internal leads 804 and the external leads 806, wherein the internal leads 804 are extended and connected or fused to the external leads 806. The internal leads 804 may be bottom half-etched under the extended interconnection to the external leads 806. The external leads 806 may also be electrically connected through the internal leads 804 to the die pad 808 to provide an electrical ground level to the second integrated circuit. For illustrative purposes the internal leads 804 are shown as connected to the external leads 806, although it is understood that the internal leads 804 and the external leads 806 may be separate, as well.

Figure 9:
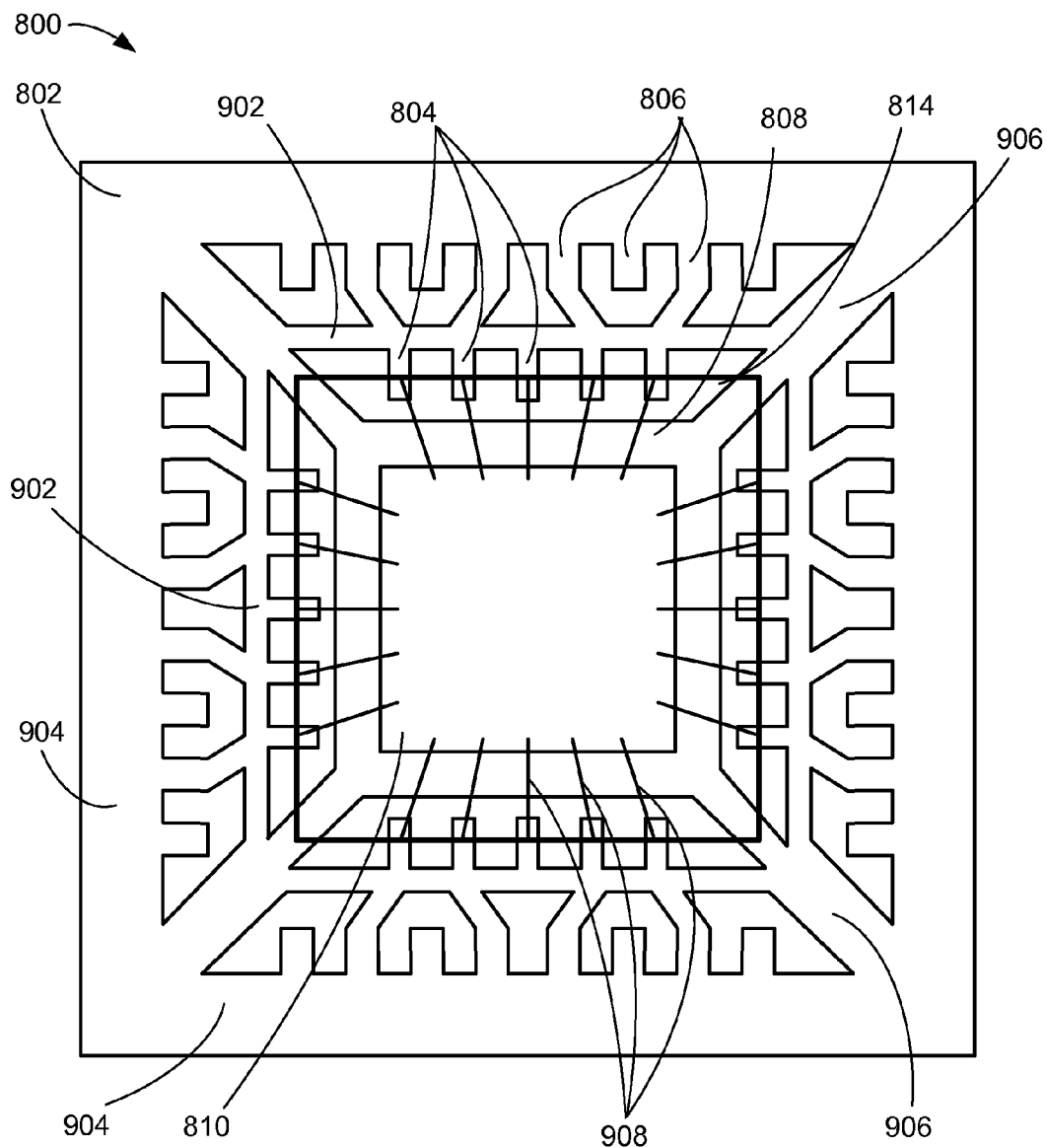
FIG. 9 is a top view of the integrated circuit package system with die and package combination in an alternative embodiment of the present invention in a first encapsulation phase.

Referring now to FIG. 9, therein is shown a top view of the integrated circuit package system with die and package combination 800 in an alternative embodiment of the present invention in a first encapsulation phase. The fused lead leadframe 802 includes internal dam bars 902, external dam bars 904 and tie bars 906. The internal dam bars 902 provide structural rigidity and substantially fixed positions to the internal leads 804 during processing. The substantially fixed positions of the internal leads 804 may be disposed at a different pitch than the external leads 806. The first integrated circuit 810 is mounted to the die pad 808 and electrically connected to the internal leads 804 by the first electrical interconnects 908. The first encapsulant 814 is formed using a molding process, such as the pocket mold method. The pocket mold method may use either a lateral gate molding system or a direct top gate molding system.

For illustrative purposes the first integrated circuit 810, the internal leads 804 and the first electrical interconnects 908 are shown, although it is understood that the first integrated circuit 810 and the first electrical interconnects 908 are covered by the first encapsulant 814, and the internal leads 804 may be partially covered by the first encapsulant 814.

Figure 10:
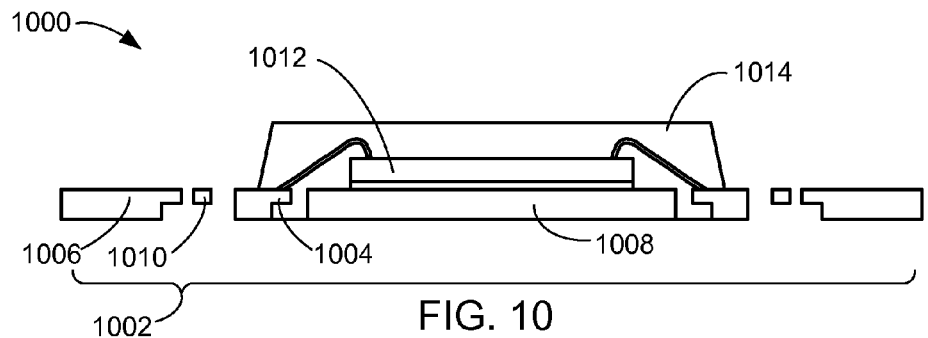
FIG. 10 is a cross-sectional view of an integrated circuit package system with die and package combination in another alternative embodiment of the present invention in a first encapsulation phase.

Referring now to FIG. 10, therein is shown a cross-sectional view of an integrated circuit package system with die and package combination 1000 in another alternative embodiment of the present invention in a first encapsulation phase. The integrated circuit package system with die and package combination 1000 includes a power-ground ring leadframe 1002 having internal leads 1004, external leads 1006, a die pad 1008 and a power-ground ring 1010. A first integrated circuit 1012, such as a bare die, a flip chip, or a passive component, and a second integrated circuit (not shown), such as a bare die, a pre-packaged system with an integrated circuit, or an interposer with active or passive components, are electrically connected to the power-ground ring leadframe 1002.

A first encapsulant 1014 is molded to cover one or more integrated circuits such as the first integrated circuit 1012 mounted to the power-ground ring leadframe 1002 and electrically connected to the internal leads 1004. The first encapsulant 1014 may form a mold cap to be used as a mounting surface, such as a die attach pad, for the second integrated circuit. A thermally or electrically conductive layer (not shown), such as a plate or cap, may also be attached to the first encapsulant 1014 prior to attaching the second integrated circuit. The conductive layer may provide thermal or electrical conduction, such as thermal dissipation or RF shielding.

The power-ground ring leadframe 1002 provides interconnection between the external leads 1006 for either or both of power and ground levels. The power-ground ring 1010 may be bottom half-etched and may provide electrical signal integrity to minimize signal degradation, such as ground bounce, IR drop, and routing at a next level system. For illustrative purposes the power-ground ring 1010 is shown as separate from the external leads 1006, although it is understood that the power-ground ring 1010 may be connected to any number of external leads, as well.

Figure 11:
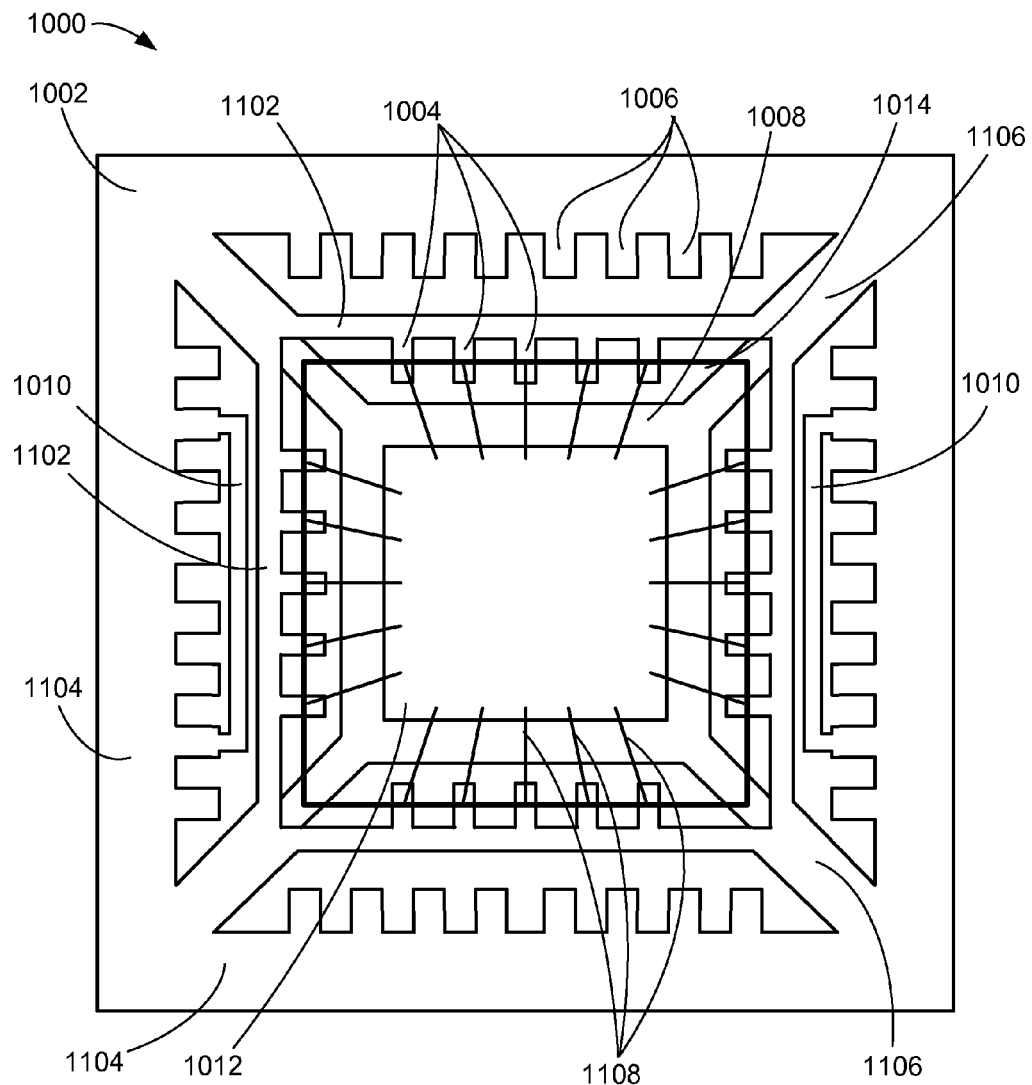
FIG. 11 is a top view of the integrated circuit package system with die and package combination in another alternative embodiment of the present invention in a first encapsulation phase.

Referring now to FIG. 11, therein is shown a top view of the integrated circuit package system with die and package combination 1000 in another alternative embodiment of the present invention in a first encapsulation phase. The power-ground ring leadframe 1002 includes internal dam bars 1102, external dam bars 1104 and tie bars 1106. The internal dam bars 1102 provide structural rigidity and substantially fixed positions to the internal leads 1004 during processing. The substantially fixed positions of the internal leads 1004 may be disposed at a different pitch than the external leads 1006.

The first integrated circuit 1012 is mounted to the die pad 1008 and electrically connected to the internal leads 1004 by the first electrical interconnects 1108. The first encapsulant 1014 is formed using a molding process, such as the pocket mold method. The pocket mold method may use either a lateral gate molding system or a direct top gate molding system.

For illustrative purposes the first integrated circuit 1012, the internal leads 1004 and the first electrical interconnects 1108 are shown, although it is understood that the first integrated circuit 1012 and the first electrical interconnects 1108 are covered by the first encapsulant 1014, and the internal leads 1004 may be partially covered by the first encapsulant 1014.

Figure 12:
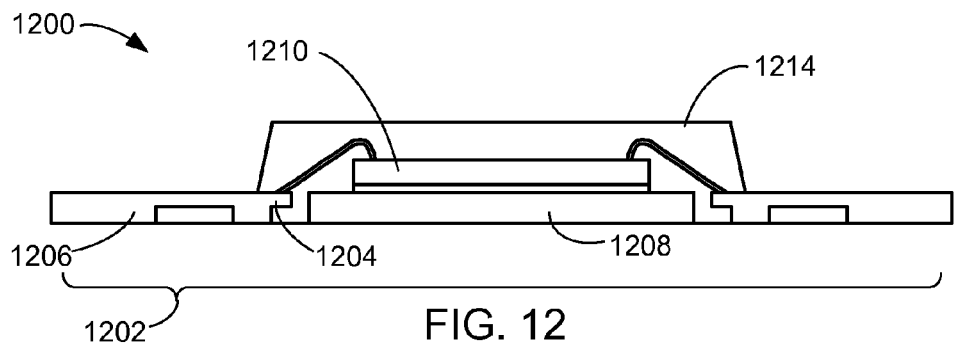
FIG. 12 is a cross-sectional view of an integrated circuit package system with die and package combination in yet another alternative embodiment of the present invention in a first encapsulation phase.

Referring now to FIG. 12, therein is shown a cross-sectional view of an integrated circuit package system with die and package combination 1200 in yet another alternative embodiment of the present invention in a first encapsulation phase. The integrated circuit package system with die and package combination 1200 includes a fused lead with single dam bar leadframe 1202 having internal leads 1204, external leads 1206 and a die pad 1208. A first integrated circuit 1210, such as a bare die, a flip chip, or a passive component, and a second integrated circuit (not shown), such as a bare die, a pre-packaged system with an integrated circuit, or an interposer with active or passive components, are electrically connected to the fused lead with single dam bar leadframe 1202.

A first encapsulant 1214 is molded to cover one or more integrated circuits such as the first integrated circuit 1210 mounted to the fused lead with single dam bar leadframe 1202 and electrically connected to the internal leads 1204. The first encapsulant 1214 may form a mold cap to be used as a mounting surface, such as a die attach pad, for the second integrated circuit. A thermally or electrically conductive layer (not shown), such as a plate or cap, may also be attached to the first encapsulant 1214 prior to attaching the second integrated circuit. The conductive layer may provide thermal or electrical conduction, such as thermal dissipation or RF shielding.

The fused lead with single dam bar leadframe 1202 may provide interconnection between the internal leads 1204 and the external leads 1206, wherein the internal leads 1204 are extended and connected or fused to the external leads 1206. The internal leads 1204 may be bottom half-etched under the interconnection to the external leads 1206. The external leads 1206 may also be electrically connected through the internal leads 1204 to the die pad 1208 to provide an electrical ground level to the second integrated circuit.

Figure 13:
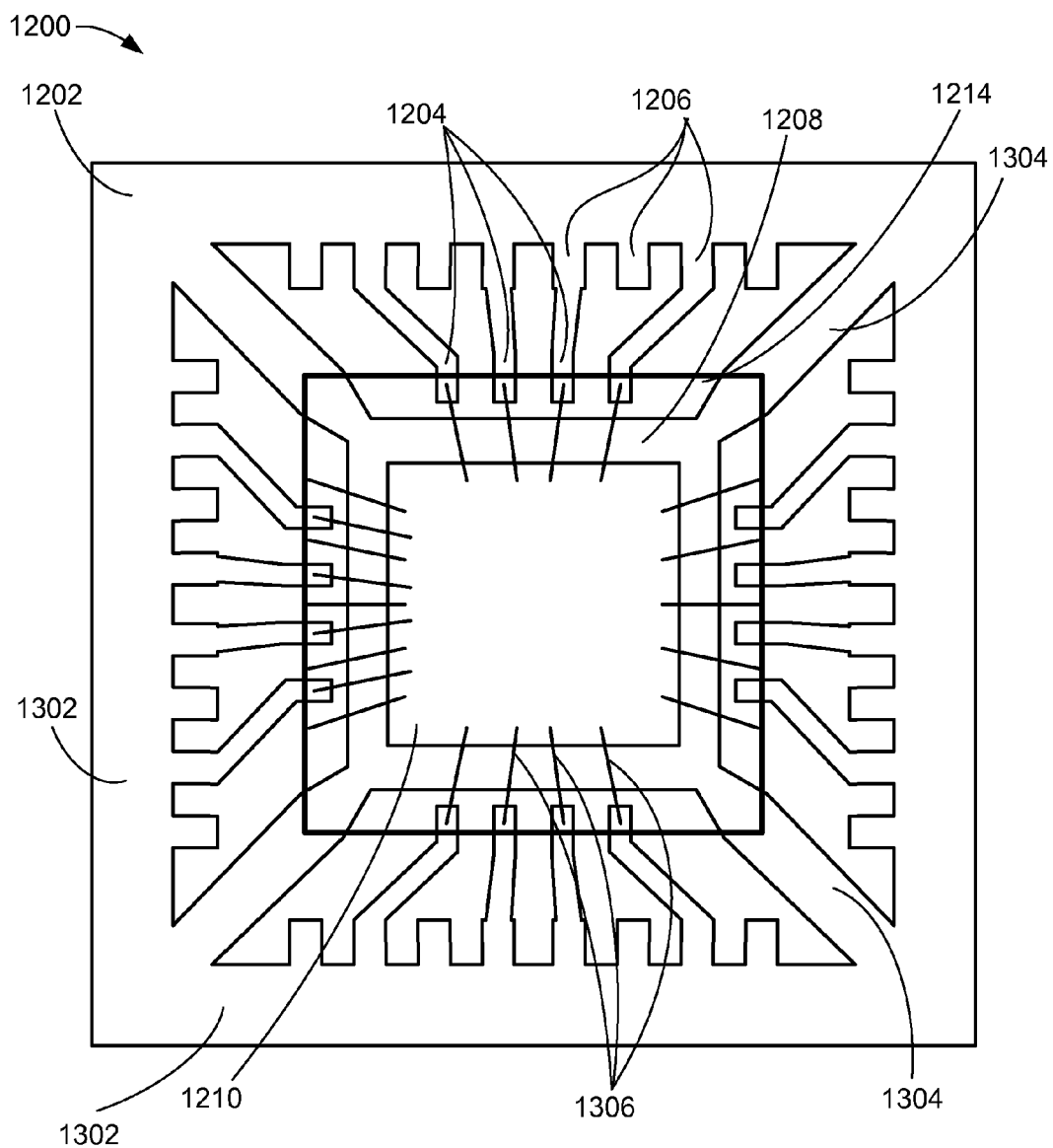
FIG. 13 is a top view of the integrated circuit package system with die and package combination in yet another alternative embodiment of the present invention in a first encapsulation phase.

Referring now to FIG. 13, therein is shown a top view of the integrated circuit package system with die and package combination 1200 in yet another alternative embodiment of the present invention in a first encapsulation phase. The fused lead with single dam bar leadframe 1202 includes external dam bars 1302 and tie bars 1304. The external dam bars 1302 provide structural rigidity and substantially fixed positions to the internal leads 1204 during processing. The substantially fixed positions of the internal leads 1204 may be disposed at a different pitch than the external leads 1206.

The first integrated circuit 1210 is mounted to the die pad 1208 and electrically connected to the internal leads 1204 by the first electrical interconnects 1306. The first encapsulant 1214 is formed using a molding process, such as the pocket mold method. The pocket mold method may use either a lateral gate molding system or a direct top gate molding system. The external dam bars 1302 provide a mold boundary for the first encapsulant 1214. A planar extent of mold flash of the first encapsulant 1214 would be smaller than or equal to an interior planar extent of the external dam bars 1302.

For illustrative purposes the first integrated circuit 1210, the internal leads 1204 and the first electrical interconnects 1306 are shown, although it is understood that the first integrated circuit 1210 and the first electrical interconnects 1306 are covered by the first encapsulant 1214, and the internal leads 1204 may be partially covered by the first encapsulant 1214.

Figure 14:
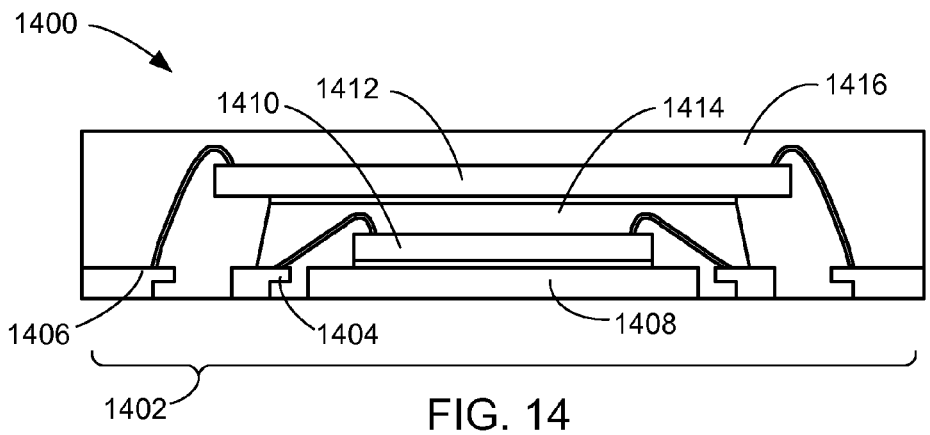
FIG. 14 is a cross-sectional view of an integrated circuit package system with die and package combination in yet another alternative embodiment of the present invention.

Referring now to FIG. 14, therein is shown a cross-sectional view of an integrated circuit package system with die and package combination 1400 in yet another alternative embodiment of the present invention. The integrated circuit package system with die and package combination 1400 is one of an array formed using a block mold method. The integrated circuit package system with die and package combination 1400 includes a leadframe 1402 having internal leads 1404, external leads 1406 and a die pad 1408. A first integrated circuit 1410, such as a bare die, a flip chip, or a passive component, and a second integrated circuit 1412, such as a bare die, a pre-packaged system with an integrated circuit, or an interposer with active or passive components, are electrically connected to the leadframe 1402.

A first encapsulant 1414 is molded to cover one or more integrated circuits such as the first integrated circuit 1410 mounted to the leadframe 1402 and electrically connected to the internal leads 1404. The first encapsulant 1414 may form a mold cap to be used as a mounting surface, such as a die attach pad, for the second integrated circuit 1412. A thermally or electrically conductive layer (not shown), such as a plate or cap, may also be attached to the first encapsulant 1414 prior to attaching the second integrated circuit 1412. The conductive layer may provide thermal or electrical conduction, such as thermal dissipation or RF shielding.

A second encapsulant 1416 may be applied using a molding process, such as a block mold method. The second encapsulant 1416 is molded to cover an array of one or more integrated circuits such as the second integrated circuit 1412 mounted over the first encapsulant 1414 and electrically connected to the external leads 1406 of the leadframe 1402. The second encapsulant 1416 provides protection to the second integrated circuit 1412, the external leads 1406 and the leadframe 1402. A singulation process, such as sawing, forms each of the integrated circuit package system with die and package combination 1400. For illustrative purposes the second encapsulant 1416 is shown as a different material than the first encapsulant 1414, although it is understood that the second encapsulant 1416 may be the same material, as well.

Figure 15:
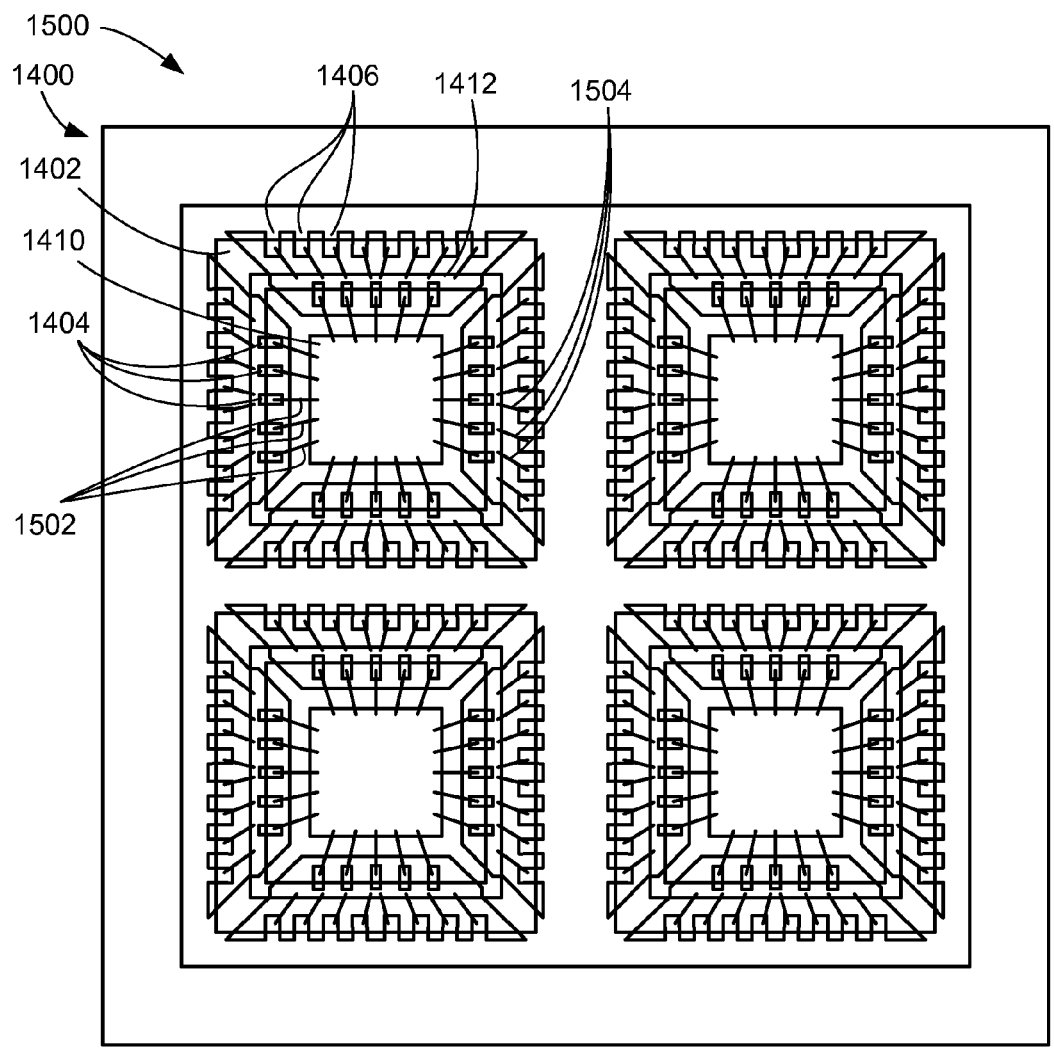
FIG. 15 is a top view of a matrix of the integrated circuit package system with die and package combination in yet another alternative embodiment of the present invention.

Referring now to FIG. 15, therein is shown a top view of a matrix 1500 of the integrated circuit package system with die and package combination 1400 in yet another alternative embodiment of the present invention. The matrix 1500 includes the array of the integrated circuit package system with die and package combination 1400. The integrated circuit package system with die and package combination 1400 includes the leadframe 1402, the first integrated circuit 1410 and the second integrated circuit 1412.

The first integrated circuit 1410 is electrically connected to the internal leads 1404 of the leadframe 1402 by first electrical interconnects 1502, such as bond wires. The second integrated circuit 1412 is mounted over the first integrated circuit 1410 mounted to the leadframe 1402. The second integrated circuit 1412 is electrically connected to the external leads 1406 of the leadframe 1402 by second electrical interconnects 1504.

For illustrative purposes the first integrated circuit 1410, the internal leads 1404 and the first electrical interconnects 1502 are shown, although it is understood that the first integrated circuit 1410, the internal leads 1404 and the first electrical interconnects 1502 are in separate plane below the second integrated circuit 1412.

Figure 16:
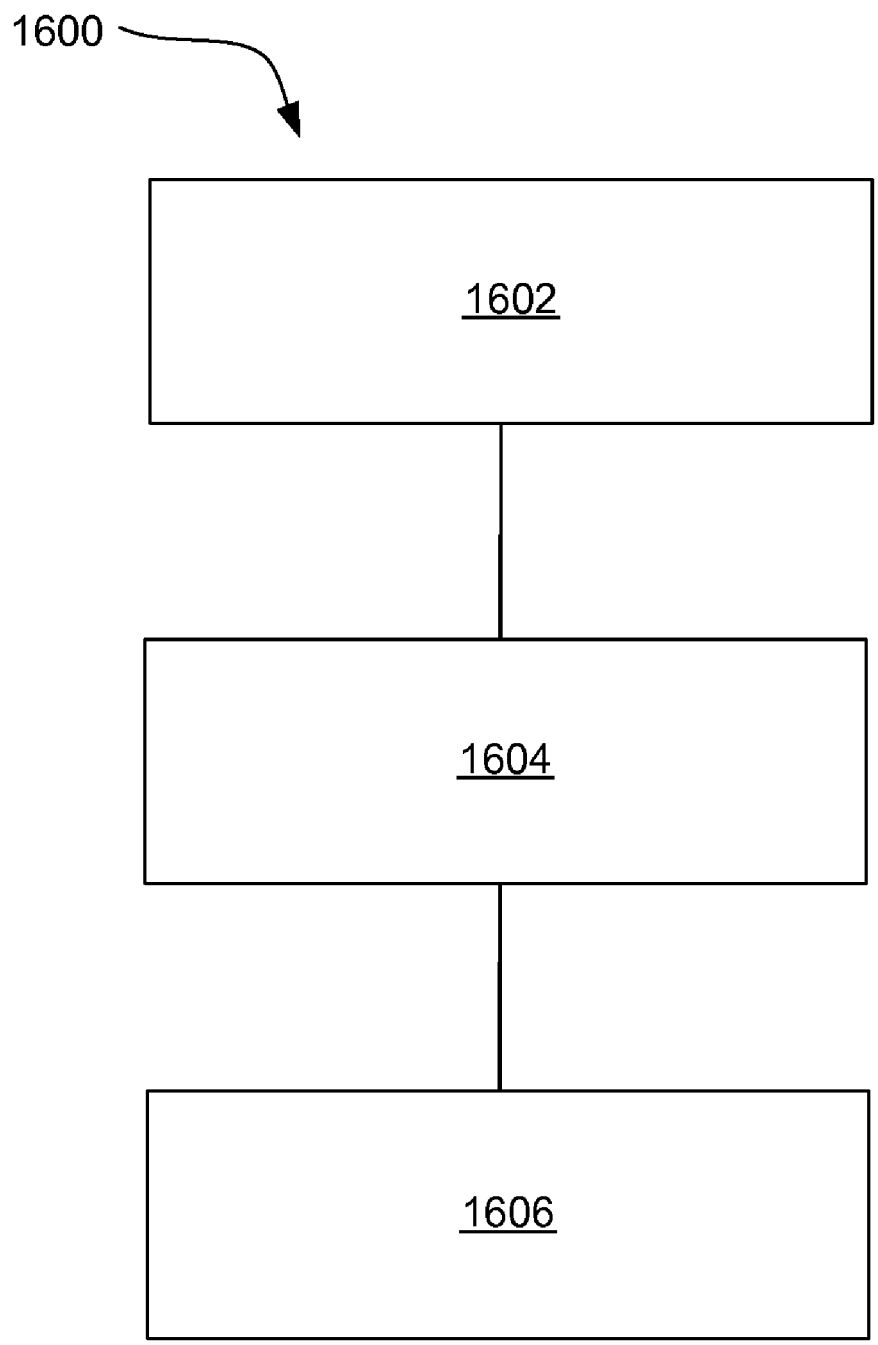
FIG. 16 is a flow chart of a system for an integrated circuit package system with die and package combination.

Referring now to FIG. 16, therein is shown a flow chart of a system 1600 for the integrated circuit package system with die and package combination 100. The system 1600 includes forming a leadframe having internal leads and external leads in a block 1602; encapsulating a first integrated circuit on the leadframe in a block 1604; and encapsulating a second integrated circuit over the first integrated circuit in a block 1606.

In greater detail, a method to fabricate the integrated circuit package system with die and package combination 100, in an embodiment of the present invention, is performed as follows:

1. Forming the leadframe 102 having the internal leads 104 and the external leads 106. (FIG. 1)
2. Mounting the first integrated circuit 110 on the leadframe 102. (FIG. 1)
3. Connecting the first electrical interconnects 202 between the first integrated circuit 110 and the internal leads 104. (FIG. 2)
4. Molding the first encapsulant 114 over the first integrated circuit 110. (FIG. 2)
5. Mounting the second integrated circuit 112 over the first integrated circuit 110. (FIG. 2)
6. Connecting the second electrical interconnects 204 between the second integrated circuit 112 and the external leads 106. (FIG. 2)
7. Molding the second encapsulant 116 over the second integrated circuit 112. (FIG. 2)

It has been discovered that the present invention thus has numerous aspects.

An aspect is that the present invention allows the first die to be assembled on the die attach pad prior to the second die assembly, with existing QFN manufacturing processes. Cost effective, mature yield, high volume processes are compatible with the first die attach. The first die benefits from a protective encapsulation of an intermediate package phase. During subsequent processing the first die is already packaged, though not in a product form, and thereby protected from manufacturing procedures and equipment.

It has been discovered that the disclosed structure includes leadframes having internal dam bars, which allow the additional I/O terminal leads to be disposed internally at the bottom surface of a QFN package. The additional leads within a fixed footprint, set by the external leads or the second integrated circuit size, provide enhanced functionality, performance and integration into a next level system.

It has also been discovered that the disclosed structure provides for a smaller bottom die that can be attached to the die attach pad and wire-bonded to the internal leads so as to obtain shorter wire lengths compared with the existing pyramid stacked die QFN or inverted pyramid stacked die QFN packages. Minimizing the distance between multiple integrated circuits provides significant improvements in electrical signals between the integrated circuits and the leadframe. The size reduction also provides shorter interconnections between integrated circuits and a next level system or product, such as a printed circuit board, chip carrier or another integrated circuit package. The shorter interconnections reduce parasitics and improve speed.

Yet another discovery of the disclosed structure is that an internal dam bar position can be formed on the interval of two tie bars and the inner leads attached along the internal dam bars can be different from those along the external dam bars. A differentiated interval of the leads provides less improved lead numbers/density, compatibility with the die I/O pads and routability in a next level system or product, such as a printed circuit board, chip carrier or another integrated circuit package.

Yet another discovery of the disclosed structure is that no additional spacer is required. An internal mold cap is formed over the first die that can serve as the spacer for a subsequent die and/or device, including a package, assembly with the existing QFN manufacturing process. The internal mold cap is also formed using existing manufacturing processes that provide cost, yield and volume benefits over an additional spacer attachment process.

These and other valuable aspects of the present invention consequently further the state of the technology to at least the next level.

Thus, it has been discovered that the integrated circuit package system with die and package combination method and apparatus of the present invention furnish important and heretofore unknown and unavailable solutions, capabilities, and functional aspects. The resulting processes and configurations are straightforward, cost-effective, uncomplicated, highly versatile and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hitherto set forth herein or shown in the accompanying drawings are to be interpreted in an illustrative and non-limiting sense.

What is claimed is:

1. An integrated package system with die and package combination comprising:
    forming a leadframe having internal leads and external leads;
    encapsulating a first integrated circuit on the leadframe;
    encapsulating a second integrated circuit over the encapsulated first integrated circuit; and
    wherein encapsulating the second integrated circuit further comprises encapsulating a package having the first integrated circuit.

2. The system as claimed in claim 1 wherein forming the leadframe further comprises forming the internal leads having a different pitch than that of the external leads.

3. The system as claimed in claim 1 wherein forming the leadframe further comprises forming a die pad and tie bars.

4. An integrated package system with die and package combination comprising:

forming a leadframe having internal leads and external leads;

mounting a first integrated circuit on the leadframe;

connecting first electrical interconnects between the first integrated circuit and the internal leads;

molding a first encapsulant over the first integrated circuit;

mounting a second integrated circuit over the encapsulated first integrated circuit;

connecting second electrical interconnects between the second integrated circuit and the external leads;

molding a second encapsulant encapsulating the second integrated circuit; and wherein molding the second encapsulant over the second integrated circuit includes molding the second encapsulant over a package having the first integrated circuit.

5. The system as claimed in claim 4 wherein forming the leadframe further comprises forming the internal leads connected to the external leads.

6. The system as claimed in claim 4 wherein forming the leadframe further comprises forming a power-ground ring interconnecting the external leads.

7. The system as claimed in claim 4 wherein forming the leadframe further comprises forming a matrix of the integrated circuit package system with die and package combination.

8. The system as claimed in claim 4 wherein mounting the second integrated circuit further comprises mounting the second integrated circuit on a mold cap formed by the first encapsulant and excluding internal dam bars.

9. An integrated package system with die and package combination comprising:

a leadframe having internal leads and external leads;

a first integrated circuit encapsulated by a first encapsulant on the leadframe; and a second integrated circuit encapsulated with the first encapsulant by a second encapsulant.

10. The system as claimed in claim 9 wherein the leadframe further comprises the internal leads having a different pitch than that of the external leads.

11. The system as claimed in claim 9 wherein the leadframe further comprises a die pad and tie bars.

12. The system as claimed in claim 9 wherein the second encapsulant further comprises a package having the first integrated circuit.

13. The system as claimed in claim 9 further comprising:

first electrical interconnects between the first integrated circuit and the internal leads of the leadframe; and second electrical interconnects between the second integrated circuit and the external leads of the leadframe.

14. The system as claimed in claim 13 wherein the leadframe further comprises the internal leads connected to the external leads.

15. The system as claimed in claim 13 wherein the leadframe further comprises a power-ground ring interconnecting the external leads.

16. The system as claimed in claim 13 wherein the leadframe further comprises a matrix of the integrated circuit package system with die and package combination.

17. The system as claimed in claim 13 wherein the second integrated circuit further comprises the second integrated circuit on a mold cap formed by a first encapsulant without internal dam bars.

\* \* \* \* \*